US012625023B2

(12) United States Patent
Greiner et al.

(10) Patent No.: US 12,625,023 B2
(45) Date of Patent: May 12, 2026

(54) CAPACITIVE MEMS SENSING DIAGNOSTIC MODE

(71) Applicant: Infineon Technologies AG, Neubiberg (DE)

(72) Inventors: Philipp Greiner, Graz (AT); Elmar Rudolf Bach, Villach (AT); Stefan Gansinger, Graz (AT); Markus Haberler, Gleisdorf (AT)

(73) Assignee: Infineon Technologies AG, Neubiberg (DE)

( * ) Notice: Subject to any disclaimer, the term of this patent is extended or adjusted under 35 U.S.C. 154(b) by 439 days.

(21) Appl. No.: 18/339,532

(22) Filed: Jun. 22, 2023

(65) Prior Publication Data

US 2024/0426689 A1 Dec. 26, 2024

(51) Int. Cl.
*G01L 9/00* (2006.01)
*B81B 7/02* (2006.01)
*G01L 9/12* (2006.01)

(52) U.S. Cl.
CPC .............. *G01L 9/0072* (2013.01); *B81B 7/02* (2013.01); *G01L 9/12* (2013.01); *B81B 2201/0264* (2013.01)

(58) Field of Classification Search
CPC ......... G01L 9/0072; G01L 9/12; G01L 1/148; G01L 1/2262; G01L 9/06; G01L 27/007; G01L 1/144; G01L 1/142; G01L 25/00; B81B 7/02; B81B 2201/0264
See application file for complete search history.

(56) References Cited

U.S. PATENT DOCUMENTS

| | | | | |
|---|---|---|---|---|
| 5,631,602 A | * | 5/1997 | Kearney | ............ G01R 31/2825 |
| | | | | 73/1.88 |
| 6,828,780 B2 | * | 12/2004 | Jagiella | ................ G01D 5/2033 |
| | | | | 324/207.16 |
| 11,193,844 B2 | | 12/2021 | Kollias et al. | |
| 2005/0248340 A1 | * | 11/2005 | Berkcan | ............ G01R 33/0286 |
| | | | | 324/117 R |
| 2016/0305997 A1 | * | 10/2016 | Wiesbauer | ............ G01L 9/0072 |
| 2024/0120894 A1 | * | 4/2024 | Tangredi | ................... H03F 3/70 |

FOREIGN PATENT DOCUMENTS

| | | |
|---|---|---|
| DE | 4412982 C1 | 9/1995 |
| WO | 2022148603 A1 | 7/2022 |
| WO | 2023169743 A1 | 9/2023 |

* cited by examiner

*Primary Examiner* — Lee E Rodak
*Assistant Examiner* — Zannatul Ferdous
(74) *Attorney, Agent, or Firm* — Slater Matsil, LLP

(57) ABSTRACT

A pressure sensor includes a microelectromechanical system (MEMS) device having a first pressure sensitive capacitor element, a second pressure sensitive capacitor element, a first reference capacitive element, and a second reference capacitive element arranged in a bridge configuration, a first output pad, and a second output pad; and an application-specific integrated circuit (ASIC) in electrical communication with the MEMS device having a first input pad and a second input pad, a measurement interface including a first input and a second input, a first switch coupled between the first input pad and the second input pad, and a second switch coupled between the second input of the measurement interface and the second input pad of the ASIC.

20 Claims, 12 Drawing Sheets

530

630

700

SELECTIVELY COUPLING A PRESSURE SENSITIVE BRIDGE TO A MEASUREMENT INTERFACE IN A FIRST SWITCH CONFIGURATION
702

SELECTIVELY COUPLING THE PRESSURE SENSITIVE BRIDGE TO A MEASUREMENT INTERFACE IN A SECOND SWITCH CONFIGURATION
704

SELECTIVELY COUPLING THE PRESSURE SENSITIVE BRIDGE TO THE MEASUREMENT INTERFACE IN A THIRD SWITCH CONFIGURATION
706

CAPACITIVE MEMS SENSING DIAGNOSTIC MODE

TECHNICAL FIELD

The present invention relates generally to a capacitive microelectromechanical system (MEMS) sensing diagnostic mode.

BACKGROUND

A capacitive pressure sensor can be implemented using pressure sensitive capacitor elements and reference capacitor elements in a fully differential bridge configuration. This configuration measures the absolute pressure expressed as a differential signal. Furthermore, by reconfiguring the bridge, a diagnostic measurement can also be performed. The diagnostic mode measures the balance (matching) between the bridge elements while the excitation effect of the measurement unit (e.g. air pressure) is strongly suppressed. An unbalanced bridge can be evidence of a defect (e.g. due to particle contamination) and can thus be used to screen out such devices. Furthermore, diagnostic measurements allow continuous monitoring of the MEMS over the device lifetime.

FIG. 1 depicts a capacitive pressure sensor bridge 100A configured in normal operation and a capacitive pressure sensor bridge 100B configured in diagnosis mode, but both using a differential read out according to the prior art.

Capacitive pressure sensor bridge 100A comprises reference capacitors elements C1 and C4, and pressure sensitive capacitors elements C2 and C3. Reference capacitor element C1 is coupled between terminal 102 designated VREF_P and terminal 104 designated VOUT_N, and reference capacitor element C4 is coupled between terminal 108 designated VREF_N and terminal 106 designated VOUT_P. Pressure sensitive capacitor element C2 is coupled between terminal 102 designated VREF_P and terminal 106 designated VOUT_P, and pressure sensitive capacitor element C3 is coupled between terminal 108 designated VREF_N and terminal 104 designated VOUT_N. The differential voltage between terminal 104 and terminal 106 provides a differential voltage representative of an input pressure, such as ambient air pressure.

Capacitive pressure sensor bridge 100B comprises reference capacitors elements C1 and C4, and pressure sensitive capacitors elements C2 and C3. Reference capacitor element C1 is coupled between terminal 102 designated VREF_P and terminal 104 designated VOUT_N, and reference capacitor element C4 is coupled between terminal 102 designated VOUT_N and terminal 106 designated VOUT_P. Pressure sensitive capacitor element C2 is coupled between terminal 108 designated VREF_N and terminal 106 designated VOUT_P, and pressure sensitive capacitor element C3 is coupled between terminal 108 designated VREF_N and terminal 104 designated VOUT_N. The differential voltage between terminal 104 and terminal 106 provides a differential voltage representative of an imbalance between a given capacitive element, and the matched values of the other three capacitive elements.

While capacitive pressure sensor bridge 100A is configured for normal operation and capacitive pressure sensor bridge 100B is configured for the diagnosis mode, it is evident that additional switches are needed to reconfigure capacitive pressure sensor bridge 100A to assume the configuration of capacitive pressure sensor bridge 100B. In MEMS technology, however, there are typically no CMOS devices for switches available. Additional switches must therefore be incorporated on to a corresponding application-specific integrated circuit (ASIC) in communication with the MEMS device. Consequently, additional connections (bonding pads, and bond wires) between the MEMS device and the ASIC are needed.

SUMMARY

According to an embodiment, a pressure sensor comprises a microelectromechanical system (MEMS) device comprising a first pressure sensitive capacitor element, a second pressure sensitive capacitor element, a first reference capacitive element, and a second reference capacitive element arranged in a bridge configuration, a first output pad, and a second output pad; and an application-specific integrated circuit (ASIC) in electrical communication with the MEMS device comprising a first input pad and a second input pad, a measurement interface including a first input and a second input, a first switch coupled between the first input and the second input, and a second switch coupled between the second input of the measurement interface and the second input pad of the ASIC.

According to another embodiment, a pressure sensor comprises a microelectromechanical system (MEMS) device comprising a first pressure sensitive capacitor element, a second pressure sensitive capacitor element, a first reference capacitive element, and a second reference capacitive element arranged in a bridge configuration, a first output pad, and a second output pad; and an application-specific integrated circuit (ASIC) in electrical communication with the MEMS device comprising a first input pad and a second input pad, a measurement interface comprising a first input and a second input, a first switch coupled between the first input of the measurement interface and the second input of the measurement interface, a second switch coupled between the second input of the measurement interface and the second input pad of the ASIC, and a third switch coupled between the first input of the measurement interface and the first input pad of the ASIC.

According to an embodiment, a pressure sensor comprises a microelectromechanical system (MEMS) device comprising a first pressure sensitive capacitor element, a second pressure sensitive capacitor element, a first reference capacitive element, and a second reference capacitive element arranged in a bridge configuration, a first output pad, and a second output pad; and an application-specific integrated circuit (ASIC) in electrical communication with the MEMS device comprising a first input pad and a second input pad, a measurement interface comprising a first input and a second input, a first switch coupled between the second input pad of the ASIC and a source of bias voltage, a second switch coupled between the second input pad of the ASIC and the second input of the measurement interface, a third switch coupled between the first input pad of the ASIC and the source of bias voltage, and a fourth switch coupled between the first input pad of the ASIC and the first input of the measurement interface.

BRIEF DESCRIPTION OF THE DRAWINGS

For a more complete understanding of the present invention, and the advantages thereof, reference is now made to the following descriptions taken in conjunction with the accompanying drawings, in which:

FIG. 5B;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to embodiments described below, the diagnostic mode of a pressure-sensitive capacitive (or resistive) MEMS device in a pressure sensor is achieved by shorting the differential outputs of the bridge inside the MEMS device, and measuring the corresponding signal in a single-ended (common mode) configuration. This configuration advantageously avoids the need for any additional connections (such as additional bonding pads, and additional bond wires) between the MEMS device and the accompanying ASIC. The pressure sensor embodiments described below can also be applied for a full bridge configuration with all elements being sensitive to the measurement unit. Furthermore, the capacitive sensor elements can also be exchanged with other pressure-sensitive elements (e.g. resistive elements such as piezoelectric resistive elements).

Figure 1:
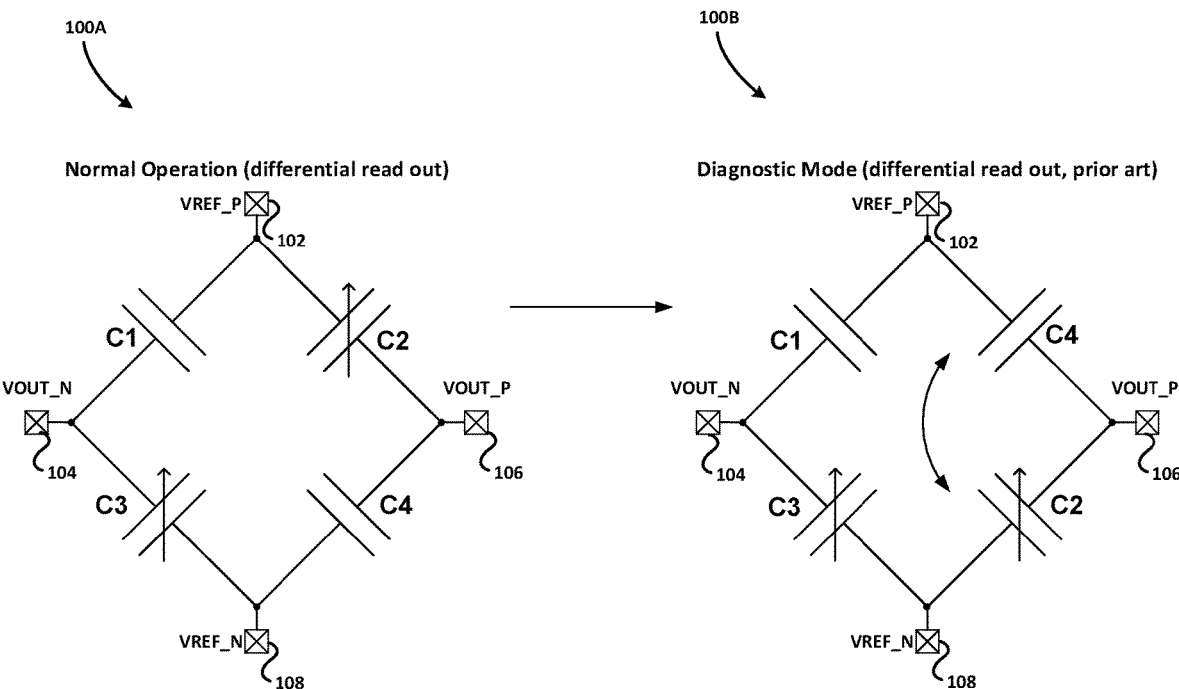
FIG. 1 is a schematic diagram of a capacitive pressure sensor bridge configured in a normal mode of operation having a differential read out, and a capacitive pressure sensor bridge configured in a diagnosis mode of operation having a differential read out.
Figure 2:
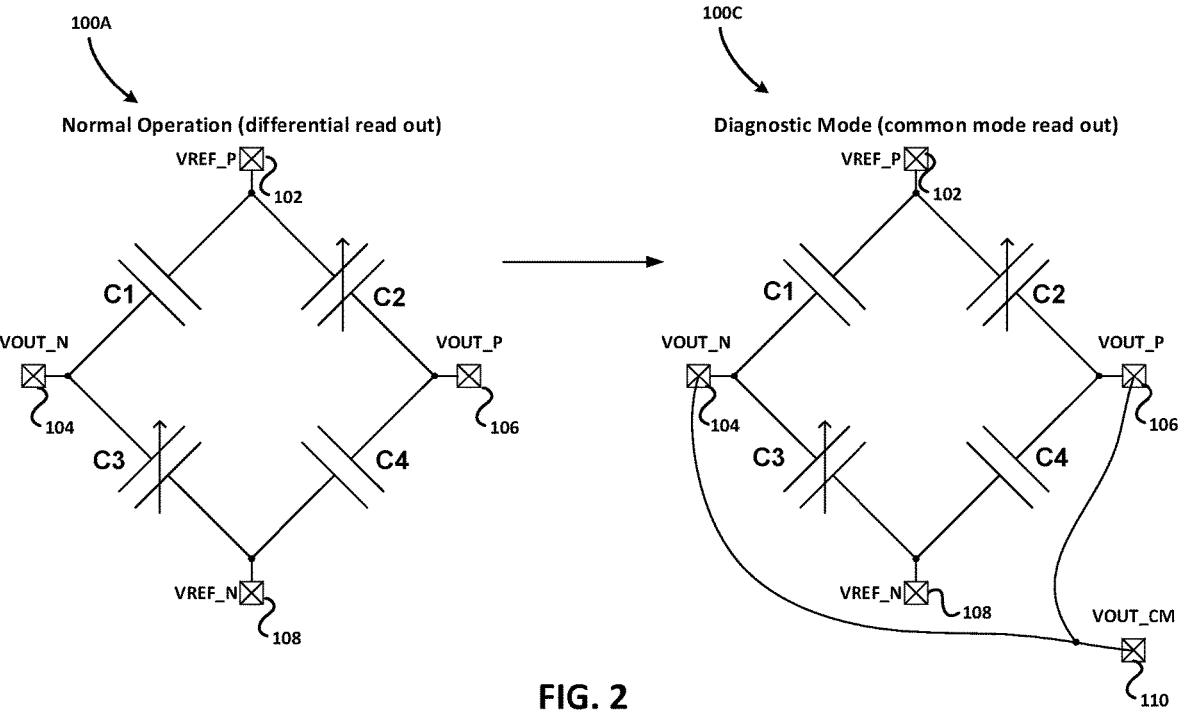
FIG. 2 is a schematic diagram of a capacitive pressure sensor bridge configured in a normal mode of operation having a differential read out, and a capacitive pressure sensor bridge configured in a diagnosis mode of operation having a common mode read out.

FIG. 2 is a schematic diagram of the capacitive pressure sensor bridge 100A configured in a normal mode of operation having a differential read out, and a capacitive pressure sensor bridge 100C configured in a diagnosis mode of operation having a single-ended (common mode) read out. Capacitive pressure sensor bridge 100A has been previously shown and described with respect to FIG. 1. Capacitive pressure sensor bridge 100C has the same capacitive elements in the same configuration as capacitive pressure sensor bridge 100B shown and described with respect to FIG. 1. However, capacitive pressure sensor bridge 100C has a short circuit between terminal 104 (VOUT_N) and terminal 106 (VOUT_P) to form a common mode terminal 110 designated VOUT_CM. In operation, the diagnostic mode using the single-ended read out at common mode terminal 110 allows a measurement of the balance (matching) between the bridge elements in capacitive pressure sensor bridge 100C while the excitation effect of the measurement (e.g. air pressure) is strongly suppressed.

Figure 3:
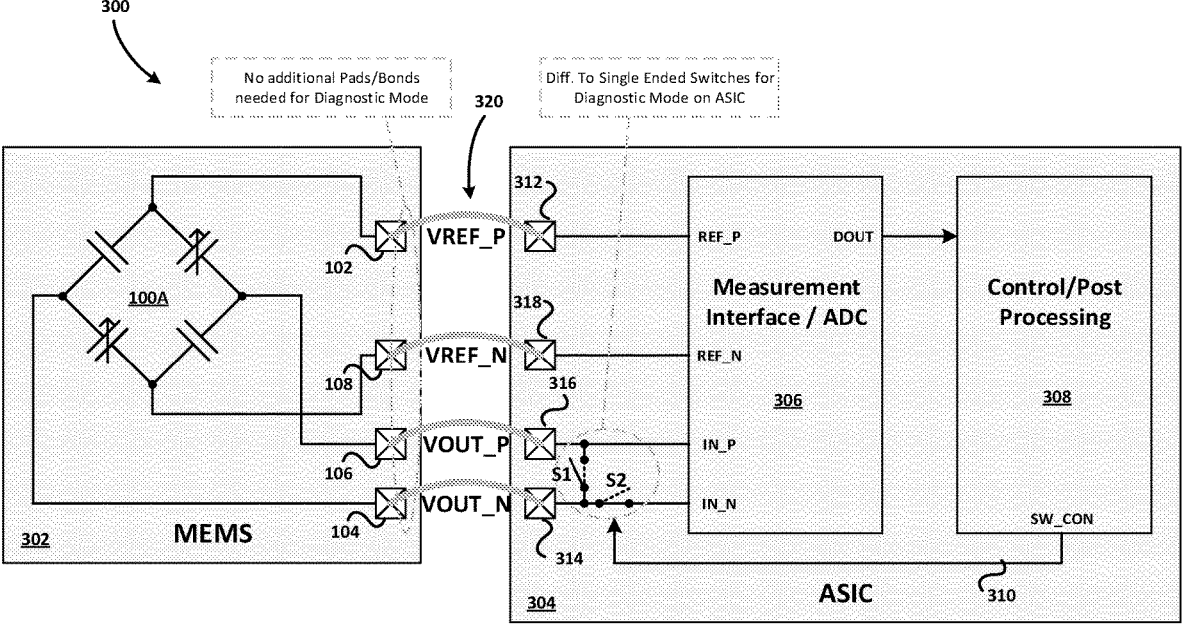
FIG. 3 is block diagram of a pressure sensor, according to a first embodiment.

FIG. 3 is block diagram of a pressure sensor 300, according to a first embodiment. Figure depicts a MEMS device 302 such as capacitive pressure sensor bridge 100A and a corresponding ASIC 304 in combination that implements a diagnostic mode using a single-ended (common mode) read out.

Switches on the ASIC 304 are used to short the MEMS device 302 output signals and to combine them into a single-ended signal. This signal is then connected to an input of a measurement interface 306 in a single-ended configuration by disconnection of one of the inputs. In a balanced MEMS device 302, the single-ended signal is close to zero volts and thus can be handled with the same differential measurement interface as the differential signal uses in normal operation mode. (A small common mode portion is handled by the differential measurement interface without degradation of the performance.) Pressure sensor 300 is described in further detail below.

Pressure sensor 300 comprises MEMS device 302 including capacitive pressure sensor bridge 100A coupled to terminal 102 (a first reference pad), terminal 108 (a second reference pad), terminal 106 (a first output pad), and terminal 104 (a second output pad). MEMS device 302 is typically fabricated as a single packaged integrated circuit using a process specifically suited to MEMS devices. Pressure sensor 300 also includes ASIC 304 including a measurement interface 306 having a first reference output (REF_P) coupled to a first reference pad 312, a second reference output (REF_N) coupled to a second reference pad 318, a first input (IN_P) coupled to a first input pad 316, and a second input (IN_N) coupled to a second input pad 314. MEMS device 302 and ASIC 304 are in electrical communication through a plurality of bond wires 320, in an embodiment. It can be seen in FIG. 3 that each of the respective reference pads of MEMS device 302 and ASIC 304 are coupled together with two bond wires, and the respective signals pads of MEMS device 302 and ASIC 304 are also coupled together with two bond wires. In the first embodiment, only eight total bonding pads and four bonding wires are required to implement a pressure sensor device having a normal mode of operation and a diagnostic mode of operation. Measurement interface 306 is in electrical communication with a control/post processing component 308, which can comprise a microprocessor or state machine, or other suitable control component. Control/post processing component 308 includes an output 310 designated SW_CON, which provides the control signals for switches S1 and S2 that are described in further detail below.

ASIC 304 comprises a first switch S1 coupled between the first input (IN_P) and the second input (IN_N), and a second switch S2 coupled between the second input (IN_N) of the measurement interface 306 and the second input pad 314 of the ASIC 304. Switch S1 and switch S2 allow implementation of a normal mode of operation (to act as a normal pressure sensing device) as well as a diagnostic mode of operation (to detect imbalances in the capacitive pressure sensor bridge).

Table 1 shows the switch configuration for the first embodiment in the normal mode of operation and in the diagnostic mode of operation.

TABLE 1

|  | Switch S1 | Switch S2 |
|---|---|---|
| Normal Mode | Open | Closed |
| Diagnostic Mode | Closed | Open |

Figure 4A:
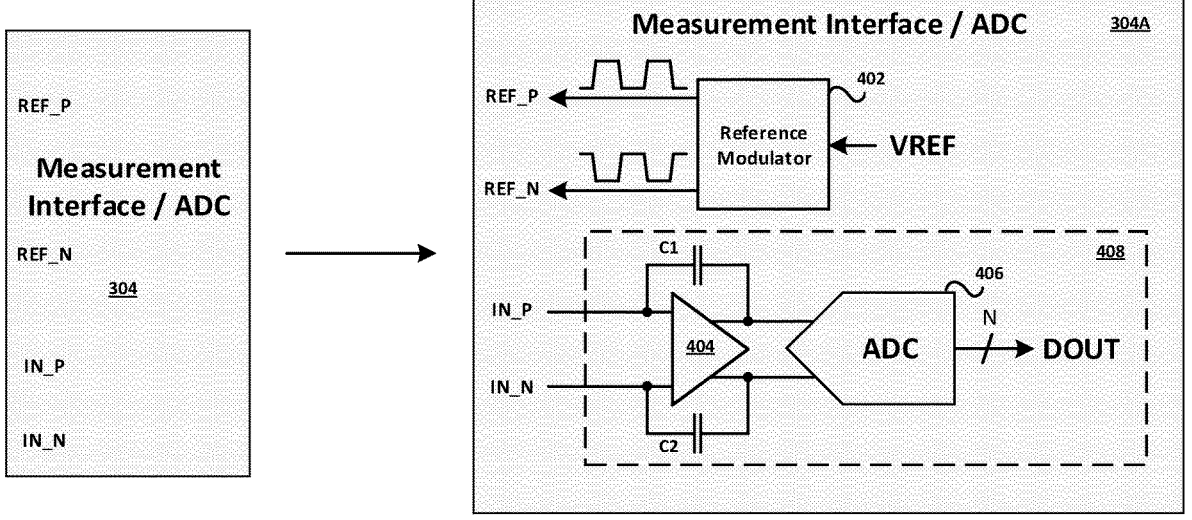
FIG. 4A, FIG. 4B, and FIG. 4C are block diagrams of a measurement interface suitable for use in the pressure sensor of FIG. 3, according to embodiments.
Figure 4B:
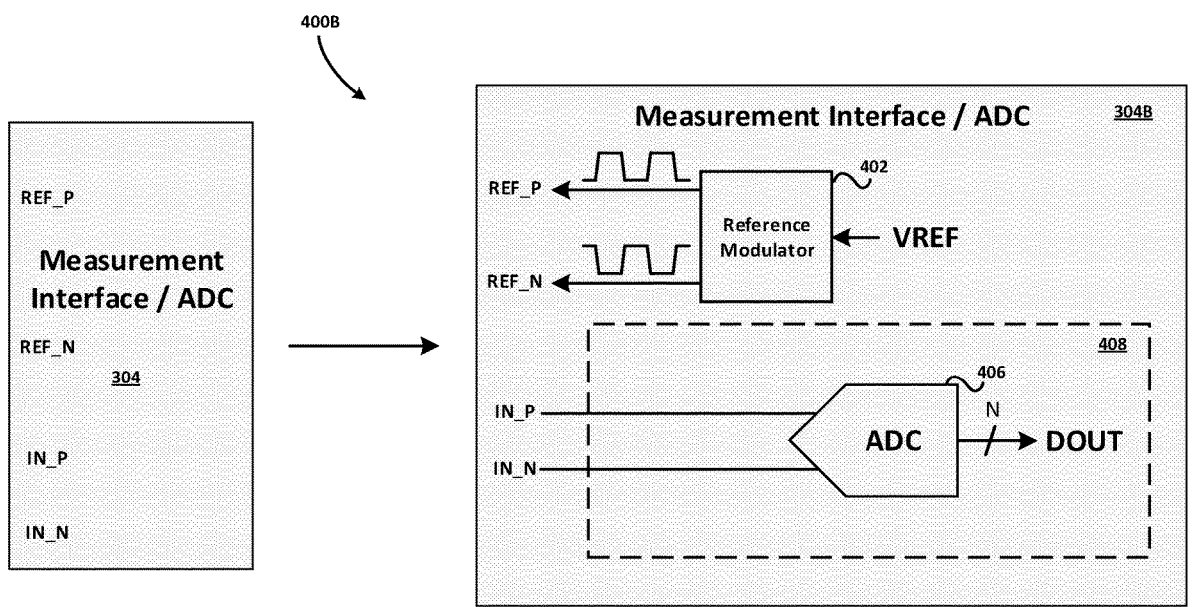
Figure 4C:
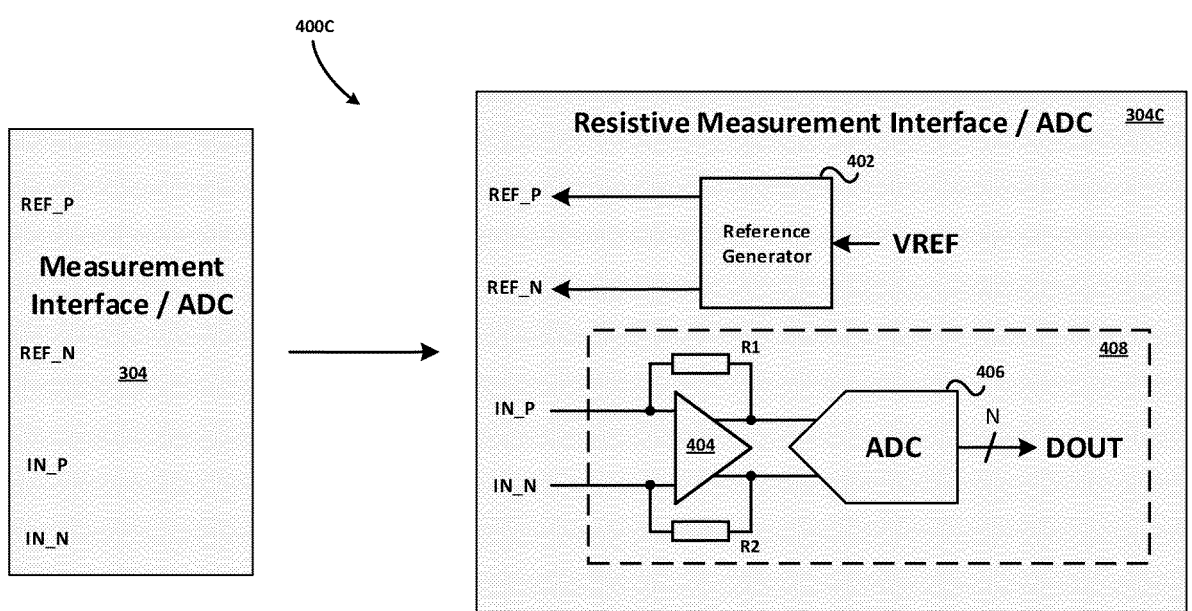

FIG. 4A, FIG. 4B, and FIG. 4C are block diagrams of a measurement interface suitable for use in the pressure sensor of FIG. 3, according to embodiments.

FIG. 4A is a detailed view of capacitive measurement interface 304A including an analog-to-digital converter (ADC) 406 having first and second inputs coupled to first and second outputs of programmable gain amplifier (PGA) 404 in measurement block 408. The output of ADC 406 comprises an N-bit digital output (DOUT) representative of a pressure signal in the normal mode of operation, and a diagnostic signal in the diagnostic mode of operation. A first input of PGA 404 is coupled to the first input (IN_P) of the capacitive measurement interface 304A, and a second of PGA 404 is coupled to the second input (IN_N) of the capacitive measurement interface 304A. PGA 404 includes a first feedback capacitor C1, and a second feedback capacitor C2, configured for amplifying the signal from MEMS device 302 (not shown in FIG. 4A). Capacitive measurement interface 304A also includes a reference modulator 402 for generating a first reference signal at the first reference output (REF_P), and for generating a second reference signal at the second reference output (REF_N), configured for properly operating the capacitive elements in the MEMS device 302. Reference modulator has an input for receiving an input reference signal VREF, which can be a DC voltage or a square wave signal depending upon the circuit design used.

FIG. 4B is a detailed view of capacitive measurement interface 304B including an analog-to-digital converter (ADC) 406 and a reference modulator 402, both of which were described above with respect to FIG. 4A. In capacitive measurement interface 304B, the outputs of ADC 406 are directly coupled to the first input (IN_P) of capacitive measurement interface 304B and to the second input (IN_N) of capacitive measurement interface 304B. In FIG. 4B the programmable gain amplifier (PGA) 404 in measurement block 408 is therefore omitted.

FIG. 4C is a detailed view of a resistive measurement interface 304C including a reference modulator 402 configured for generating DC reference voltages at the first reference output (REF_P) and at the second reference output (REF_N). The measurement block 408 is substantially the same as previously described with respect to FIG. 4A. However, feedback capacitor C1 is replaced with a feedback resistor R1, and feedback capacitor C2 is replaced with a feedback resistor R2. The DC references voltages, and the substitution of feedback resistors R1 and R2 are made so that resistive measurement interface 304C is operable with a resistive MEMS device (best seen in FIG. 5B and described in further detail below.)

Figure 5A:
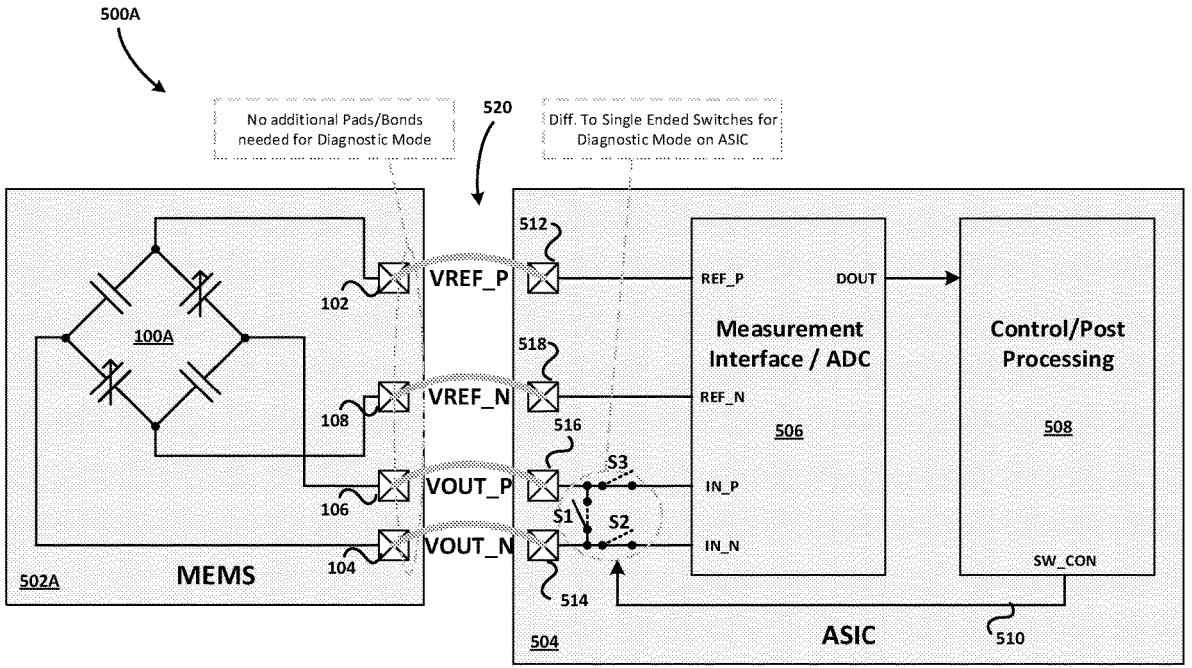
FIG. 5A and FIG. 5B are a block diagrams of a pressure sensor, according to a second embodiment.
Figure 5B:
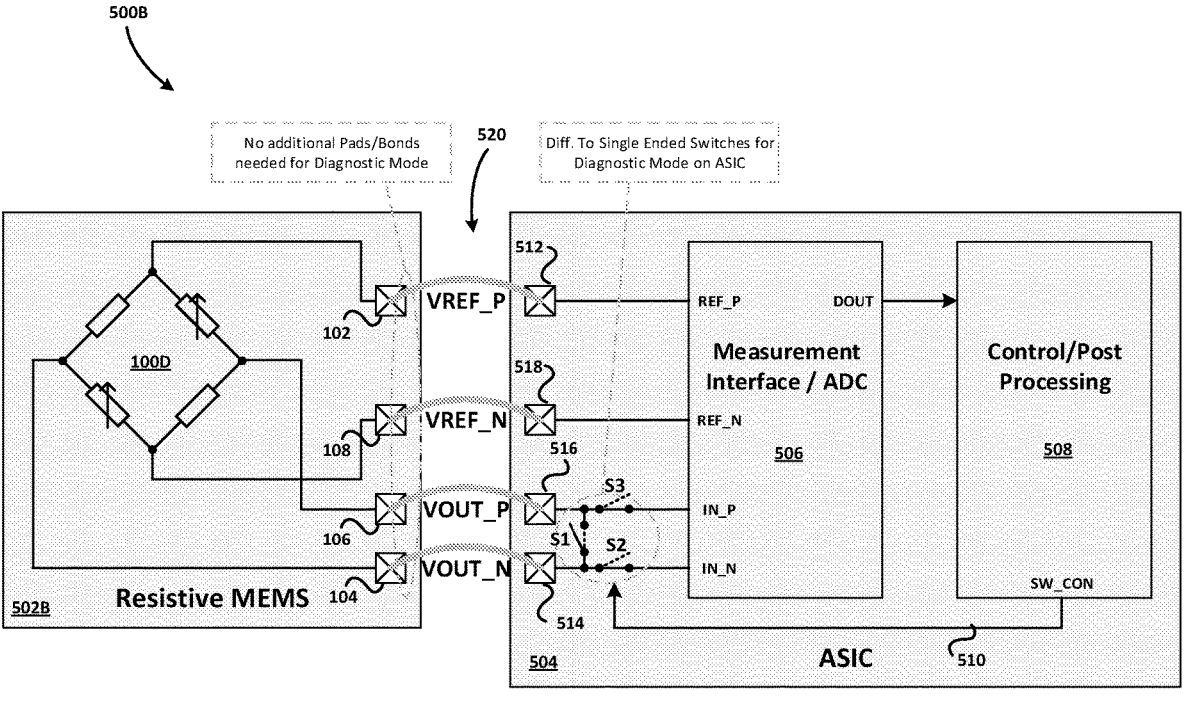

FIG. 5A is a block diagram of a capacitive pressure sensor 500A, and FIG. 5B is a block diagram of a resistive pressure sensor 500B, according to a second embodiment. In particular, a second switch on the other differential input of the measurement interface is added in order to allow the diagnostic mode measurement to be performed sequentially for higher accuracy. FIGS. 5A and 5B thus depicts a MEMS device and ASIC in combination that implements a diagnostic mode using a single-ended (common mode) read out for both of the measurement interface inputs.

FIG. 5A shows a capacitive pressure sensor 500A comprising a MEMS device 502A including a capacitive pressure sensor bridge 100A, previously described, coupled to reference pads and output pads also previously described. Capacitive pressure sensor 500A also comprises an ASIC 504 including a first reference pad 512, a second reference pad 518, a first input pad 516, and a second input pad 514, similar to reference pads and input pads previously described in the first embodiment shown in FIG. 3. ASIC 504 includes a measurement interface 506 and a control/post processing component 508 having an output 510, that are similar to a measurement interface and control/processing component previously described in the first embodiment shown in FIG. 3. MEMS device 502A and ASIC 504 are in electrical communication via a plurality of bond wires 520.

In particular, ASIC 504 includes a first switch S1, a second switch S2, and a third switch S3 that implements a sequential diagnostic mode that measures a single-ended output signal from capacitive pressure sensor bridge 100A, and implements a normal mode of operation that measures a differential signal from capacitive pressure sensor bridge 100A. ASIC 504 includes a first switch S1 coupled between the first input (IN_P) of the measurement interface 506 and the second input (IN_N) of the measurement interface 506, a second switch S2 coupled between the second input (IN_N) of the measurement interface 506 and the second input pad 514 of the ASIC, and a third switch S3 coupled between the first input (IN_P) of the measurement interface 506 and the first input pad 516 of the ASIC.

FIG. 5B is a block diagram of a resistive pressure sensor 500B that is similar in topology and operation as previously described with respect to the capacitive pressure sensor 500A shown in FIG. 5A. Capacitive pressure sensor bridge 100A, however, is replaced by resistive pressure sensor bridge 100D. The pressure sensitive capacitor elements are replaced by pressure sensitive resistor elements, and the reference capacitor elements are replaced by reference resistor elements in resistive pressure sensor bridge 100D.

Table 2 shows the switch configuration for the second embodiment in a normal mode of operation, in a first measurement step (Diagnostic Mode A) and in a second measurement step (Diagnostic Mode B) of a diagnostic mode of operation.

TABLE 2

|  | Switch S1 | Switch S2 | Switch S3 |
|---|---|---|---|
| Diagnostic Mode A | Closed | Open | Closed |
| Diagnostic Mode B | Closed | Closed | Open |
| Normal Mode | Open | Closed | Closed |

Figure 5C:
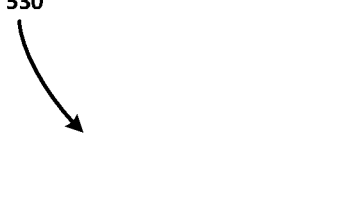
FIG. 5C is a timing diagram associated with the pressure sensors of FIG. 5A.
Figure 5C:
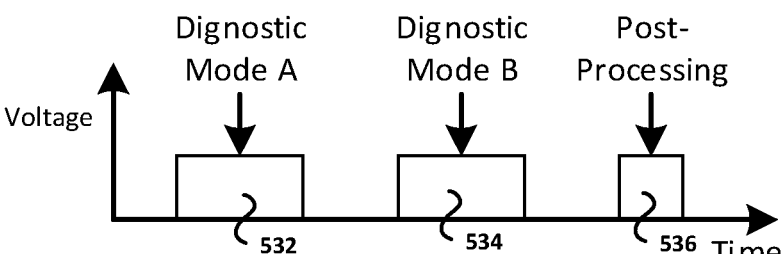

FIG. 5C is a timing diagram 530 associated with the pressure sensors of FIG. 5A and FIG. 5B, illustrating the sequential steps A and B in the diagnostic mode. During a first period of time 532, the switches are arranged as set forth above in Diagnostic Mode A, and the result is stored in the control/post processing component 508. During a second period of time 534, the switches are arranged as set forth above in Diagnostic Mode B, and the result is stored in the control/post processing component 508. During a third period of time, post-processing is undertaken in control/post processing component 508 to calculate a final result by, for example, subtracting a first measurement value during Diagnostic Mode A from a second measurement value during Diagnostic Mode B. The final result advantageously has double the signal amplitude and cancels out ASIC nonidealities.

Figure 6A:
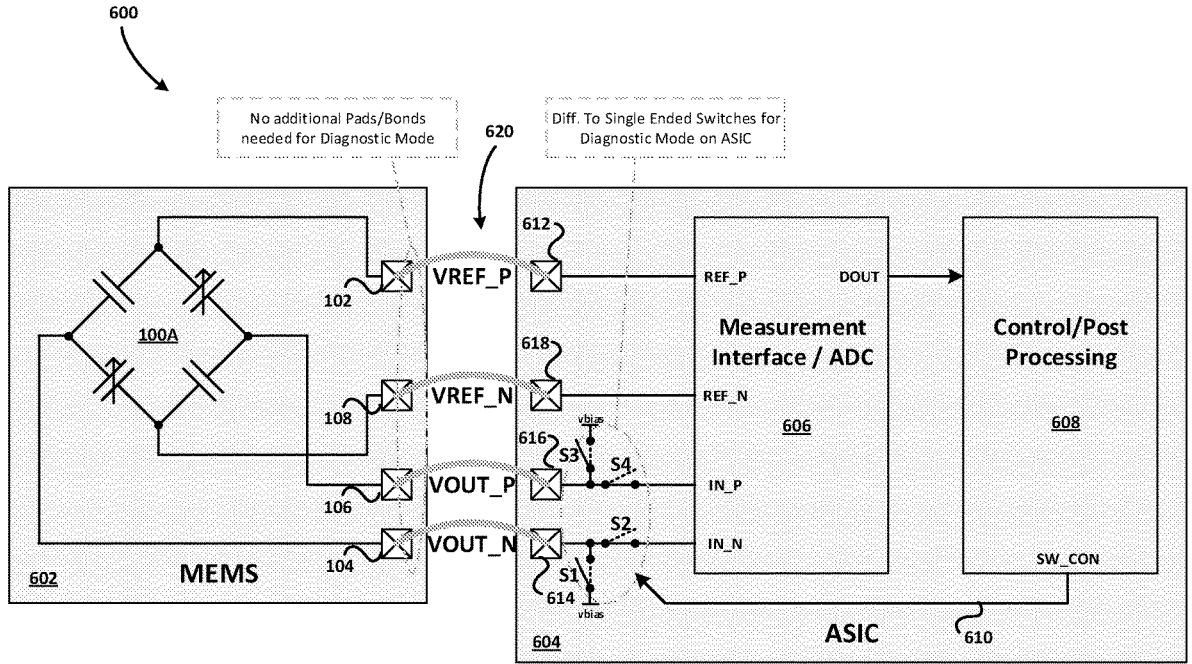
FIG. 6A is a block diagram of a pressure sensor, according to a third embodiment.

FIG. 6A is a block diagram of a pressure sensor 600, according to a third embodiment. Instead of shorting the differential output of the capacitive pressure sensor bridge as in the first two embodiments, the two differential outputs of the MEMS device are disconnected from the measurement interface and connected to a bias voltage vbias (wherein the bias voltage vbias can be the common mode voltage, vss) in two sequential measurement steps described in further detail below. The results from the two sequential measurements can subsequently be subtracted to obtain a measure for the balance of the bridge.

FIG. 6A shows a pressure sensor 600 comprising a MEMS device 602 including a capacitive pressure sensor bridge 100A, previously described, coupled to reference pads and output pads also previously described. Pressure sensor 600 also comprises an ASIC 604 including a first reference pad 612, a second reference pad 618, a first input pad 616, and a second input pad 614, similar to reference pads and input pads previously described. ASIC 604 includes a measurement interface 606 and a control/post processing component 608 having an output 610, that are similar to a measurement interface and control/processing component previously described. MEMS device 602 and ASIC 604 are in electrical communication via a plurality of bond wires 620.

In particular, ASIC 604 includes a first switch S1, a second switch S2, a third switch S3, and a fourth switch S4 that also implements a sequential diagnostic mode that measures differential output signals from capacitive pressure sensor bridge 100A, and implements a normal mode of operation that measures a differential signal from capacitive pressure sensor bridge 100A. ASIC 604 includes a first switch S1 coupled between the second input pad 614 of the ASIC and a source of bias voltage (vbias), a second switch S2 coupled between the second input pad 614 of the ASIC and the second input IN_N of the measurement interface 606, a third switch S3 coupled between the first input pad 616 of the ASIC and the source of bias voltage (vbias), and a fourth switch S4 coupled between the first input pad 616 of the ASIC and the second input (IN_P) of the measurement interface 606.

Table 3 shows the switch configuration for the third embodiment in a normal mode of operation, in a first measurement step (Diagnostic Mode A) and in a second measurement step (Diagnostic Mode B) of a diagnostic mode of operation.

TABLE 3

| | Switch S1 | Switch S2 | Switch S3 | Switch S4 |
|---|---|---|---|---|
| Normal Mode | Open | Closed | Open | Closed |
| Diagnostic Mode A | Closed | Open | Open | Closed |
| Diagnostic Mode B | Open | Closed | Closed | Open |

Figure 6B:
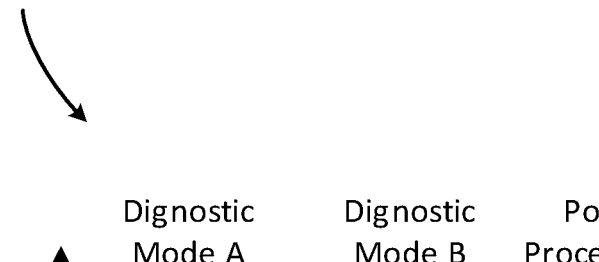
FIG. 6B is a timing diagram associated with the pressure sensors of FIG. 6A.

FIG. 6B is a timing diagram 630 associated with the pressure sensors of FIG. 6A, illustrating the sequential steps A and B in the diagnostic mode. During a first period of time 632, the switches are arranged as set forth above in Diagnostic Mode A, and the result is stored in the control/post processing component 608. During a second period of time 634, the switches are arranged as set forth above in Diagnostic Mode B, and the result is stored in the control/post processing component 608. During a third period of time, post-processing is undertaken in control/post processing component 608 to calculate a final result by, for example, subtracting a first measurement value during Diagnostic Mode A from a second measurement value during Diagnostic Mode B. The final result advantageously has double the signal amplitude and cancels out ASIC nonidealities.

Figure 7:
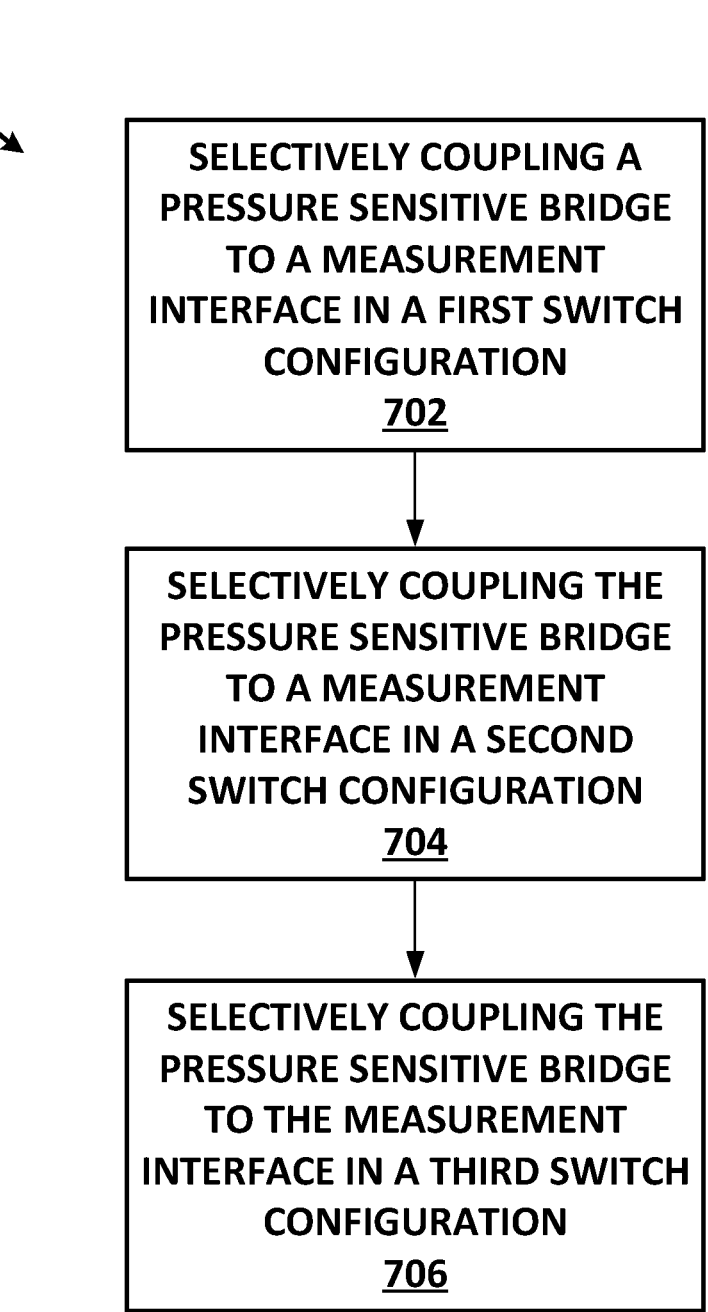
FIG. 7 is a flow chart of a method of operating a pressure sensor, according to an embodiment.

FIG. 7 is a flow chart 700 of a method of operating a pressure sensor, including a pressure sensitive bridge coupled to a measurement interface through first, second, third, and fourth switches, the method comprising selectively coupling the pressure sensitive bridge to the measurement interface in a first switch configuration during a first sequential step of a diagnostic mode at step 702; selectively coupling the pressure sensitive bridge to the measurement interface in a second switch configuration during a second sequential step of the diagnostic mode at step 704; and selectively coupling the pressure sensitive bridge to the measurement interface in a third switch configuration during a normal mode of operation at step 706. The method further comprises post processing a result of the first sequential step and a result of the second sequential step to provide a diagnostic mode result. Other methods of operating a pressure sensor, can include two or three switches as previously described.

Embodiments of a pressure described herein advantageously implement a diagnostic mode for a MEMS device without the need for additional connections (such as external bonding pads, and external bond wires) between the MEMS device and an associated ASIC. Additional switches on the ASIC side can be added with little cost or degradation of performance. For example, the switches of the second and third embodiments could be combined for a total of five switches to provide maximum flexibility in the normal and diagnostic modes. Moreover, any of the embodiments described herein can use a resistive or capacitive pressure sensitive bridge, and can use any suitable version of the measurement interface. In some embodiments, the control/post processing component can be external to the ASIC. In some embodiments, the switches can be implemented as NMOS or PMOS transistors switches, or combinations thereof.

Example embodiments of the present invention are summarized here. Other embodiments can also be understood from the entirety of the specification and the claims filed herein.

Example 1. According to an embodiment, a pressure sensor comprises:

a microelectromechanical system (MEMS) device comprising a first pressure sensitive capacitor element, a second pressure sensitive capacitor element, a first reference capacitive element, and a second reference capacitive element arranged in a bridge configuration, a first output pad, and a second output pad; and an application-specific integrated circuit (ASIC) in electrical communication with the MEMS device comprising a first input pad and a second input pad, a measurement interface including a first input and a second input, a first switch coupled between the first input pad and the second input pad, and a second switch coupled between the second input of the measurement interface and the second input pad of the ASIC.

Example 2. The pressure sensor of Example 1, wherein the first pressure sensitive capacitor element and the first reference capacitive element are coupled to a first reference pad of the MEMS device, and wherein the second pressure sensitive capacitor element and the second reference capacitive element are coupled to a second reference pad of the MEMS device.

Example 3. The pressure sensor of any of the above examples, wherein the first pressure sensitive capacitor element and the second reference capacitive element are coupled to the first output pad of the MEMS device, and wherein the second pressure sensitive capacitor element and the first reference capacitive element are coupled to the second output pad of the MEMS device.

Example 4. The pressure sensor of any of the above examples, wherein the measurement interface comprises a differential amplifier.

Example 5. The pressure sensor of any of the above examples, wherein the measurement interface comprises an analog-to-digital converter (ADC).

Example 6. The pressure sensor of any of the above examples, wherein the measurement interface comprises a first reference voltage source coupled to a first reference pad of the ASIC; and a second reference voltage source coupled to a second reference pad of the ASIC.

Example 7. According to an embodiment, a pressure sensor comprising a microelectromechanical system (MEMS) device comprises:

a first pressure sensitive capacitor element, a second pressure sensitive capacitor element, a first reference capacitive element, and a second reference capacitive element arranged in a bridge configuration, a first output pad, and a second output pad; and an application-specific integrated circuit (ASIC) in electrical communication with the MEMS device comprising a first input pad and a second input pad, a measurement interface comprising a first input and a second input, a first switch coupled between the first input pad of the measurement interface and the second input pad of the measurement interface, a second switch coupled between the second input of the measurement interface and the second input pad of the ASIC, and a third switch coupled between the first input of the measurement interface and the first input pad of the ASIC.

Example 8. The pressure sensor of Example 7, wherein the first pressure sensitive capacitor element and the first reference capacitive element are coupled to a first reference pad of the MEMS device, and wherein the second pressure sensitive capacitor element and the second reference capacitive element are coupled to a second reference pad of the MEMS device, Example 9. The pressure sensor of any of the above examples, wherein the first pressure sensitive capacitor element and the second reference capacitive element are coupled to the first output pad of the MEMS device, and wherein the second pressure sensitive capacitor element and the first reference capacitive element are coupled to the second output pad of the MEMS device.

Example 10. The pressure sensor of any of the above examples, wherein the measurement interface comprises a differential amplifier.

Example 11. The pressure sensor of any of the above examples, wherein the measurement interface comprises an analog-to-digital converter (ADC).

Example 12. The pressure sensor of any of the above examples, wherein the measurement interface comprises a first reference voltage source coupled to a first reference pad of the ASIC; and a second reference voltage coupled to a second reference pad of the ASIC.

Example 13. According to an embodiment, a pressure sensor comprises:

a microelectromechanical system (MEMS) device comprising a first pressure sensitive capacitor element, a second pressure sensitive capacitor element, a first reference capacitive element, and a second reference capacitive element arranged in a bridge configuration, a first output pad, and a second output pad; and an application-specific integrated circuit (ASIC) in electrical communication with the MEMS device comprising a first input pad and a second input pad, a measurement interface comprising a first input and a second input, a first switch coupled between the second input pad of the ASIC and a source of bias voltage, a second switch coupled between the second input pad of the ASIC and the second input of the measurement interface, a third switch coupled between the first input pad of the ASIC and the source of bias voltage, and a fourth switch coupled between the first input pad of the ASIC and the first input of the measurement interface.

Example 14. The pressure sensor of Example 13, further comprising a fifth switch coupled between the first output pad of the ASIC and the second output pad of the ASIC.

Example 15. The pressure sensor of any of the above examples, wherein the first pressure sensitive capacitor element and the first reference capacitive element are coupled to a first reference pad of the MEMS device, and wherein the second pressure sensitive capacitor element and the second reference capacitive element are coupled to a second reference pad of the MEMS device.

Example 16. The pressure sensor of any of the above examples, wherein the first pressure sensitive capacitor element and the second reference capacitive element are coupled to the first output pad of the MEMS device, and wherein the second pressure sensitive capacitor element and the first reference capacitive element are coupled to the second output pad of the MEMS device.

Example 17. The pressure sensor of any of the above examples, wherein the measurement interface comprises a differential amplifier.

Example 18. The pressure sensor of any of the above examples, wherein the measurement interface comprises an analog-to-digital converter (ADC).

Example 19. The pressure sensor of any of the above examples, wherein the measurement interface comprises a first reference voltage source coupled to a first reference pad of the ASIC; and a second reference voltage source coupled to a second reference pad of the ASIC.

Example 20. The pressure sensor of any of the above examples, wherein the first switch, the second switch, the third switch, and the fourth switch are set in a first configuration for a normal mode of operation, and wherein the first switch, the second switch, the third switch, and the fourth switch are set in a second configuration for a diagnostic mode of operation.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A pressure sensor comprising:
a microelectromechanical system (MEMS) device comprising a first pressure sensitive capacitor element, a second pressure sensitive capacitor element, a first reference capacitive element, and a second reference capacitive element arranged in a bridge configuration, a first output pad, and a second output pad; and
an application-specific integrated circuit (ASIC) in electrical communication with the MEMS device comprising a first input pad and a second input pad, a measurement interface including a first input and a second input, a first switch coupled between the first input pad and the second input pad, and a second switch coupled between the second input of the measurement interface and the second input pad of the ASIC,
wherein the first output pad of the MEMS device is directly connected to the first input pad of the ASIC, and wherein the second output pad of the MEMS device is directly connected to the second input pad of the ASIC.

2. The pressure sensor of claim 1,
wherein the first pressure sensitive capacitor element and the first reference capacitive element are coupled to a first reference pad of the MEMS device, and
wherein the second pressure sensitive capacitor element and the second reference capacitive element are coupled to a second reference pad of the MEMS device.

3. The pressure sensor of claim 1,
wherein the first pressure sensitive capacitor element and the second reference capacitive element are coupled to the first output pad of the MEMS device, and
wherein the second pressure sensitive capacitor element and the first reference capacitive element are coupled to the second output pad of the MEMS device.

4. The pressure sensor of claim 1, wherein the measurement interface comprises a differential amplifier.

5. The pressure sensor of claim 1, wherein the measurement interface comprises an analog-to-digital converter (ADC).

6. The pressure sensor of claim 1, wherein the measurement interface comprises:
a first reference voltage source coupled to a first reference pad of the ASIC; and
a second reference voltage source coupled to a second reference pad of the ASIC.

7. A pressure sensor comprising:
a microelectromechanical system (MEMS) device comprising a first pressure sensitive capacitor element, a second pressure sensitive capacitor element, a first reference capacitive element, and a second reference capacitive element arranged in a bridge configuration, a first output pad, and a second output pad; and
an application-specific integrated circuit (ASIC) in electrical communication with the MEMS device comprising a first input pad and a second input pad, a measurement interface comprising a first input and a second input, a first switch coupled between the first input pad of the ASIC and the second input pad of the ASIC, a second switch coupled between the second input of the measurement interface and the second input pad of the ASIC, and a third switch coupled between the first input of the measurement interface and the first input pad of the ASIC,
wherein the first output pad of the MEMS device is directly connected to the first input pad of the ASIC, and wherein the second output pad of the MEMS device is directly connected to the second input pad of the ASIC.

8. The pressure sensor of claim 7,
wherein the first pressure sensitive capacitor element and the first reference capacitive element are coupled to a first reference pad of the MEMS device, and
wherein the second pressure sensitive capacitor element and the second reference capacitive element are coupled to a second reference pad of the MEMS device.

9. The pressure sensor of claim 7,
wherein the first pressure sensitive capacitor element and the second reference capacitive element are coupled to the first output pad of the MEMS device, and
wherein the second pressure sensitive capacitor element and the first reference capacitive element are coupled to the second output pad of the MEMS device.

10. The pressure sensor of claim 7, wherein the measurement interface comprises a differential amplifier.

11. The pressure sensor of claim 7, wherein the measurement interface comprises an analog-to-digital converter (ADC).

12. The pressure sensor of claim 7, wherein the measurement interface comprises:
a first reference voltage source coupled to a first reference pad of the ASIC; and
a second reference voltage coupled to a second reference pad of the ASIC.

13. A pressure sensor comprising:
a microelectromechanical system (MEMS) device comprising a first pressure sensitive capacitor element, a second pressure sensitive capacitor element, a first reference capacitive element, and a second reference capacitive element arranged in a bridge configuration, a first output pad, and a second output pad; and
an application-specific integrated circuit (ASIC) in electrical communication with the MEMS device comprising a first input pad and a second input pad, a measurement interface comprising a first input and a second input, a first switch coupled between the second input pad of the ASIC and a source of bias voltage, a second switch coupled between the second input pad of the ASIC and the second input of the measurement interface, a third switch coupled between the first input pad of the ASIC and the source of bias voltage, and a fourth switch coupled between the first input pad of the ASIC and the first input of the measurement interface,
wherein the first output pad of the MEMS device is directly connected to the first input pad of the ASIC, and wherein the second output pad of the MEMS device is directly connected to the second input pad of the ASIC.

14. The pressure sensor of claim 13, further comprising a fifth switch coupled between the first input pad of the ASIC and the second input pad of the ASIC.

15. The pressure sensor of claim 13,
wherein the first pressure sensitive capacitor element and the first reference capacitive element are coupled to a first reference pad of the MEMS device, and
wherein the second pressure sensitive capacitor element and the second reference capacitive element are coupled to a second reference pad of the MEMS device.

16. The pressure sensor of claim 13,
wherein the first pressure sensitive capacitor element and the second reference capacitive element are coupled to the first output pad of the MEMS device, and
wherein the second pressure sensitive capacitor element and the first reference capacitive element are coupled to the second output pad of the MEMS device.

17. The pressure sensor of claim 13, wherein the measurement interface comprises a differential amplifier.

18. The pressure sensor of claim 13, wherein the measurement interface comprises an analog-to-digital converter (ADC).

19. The pressure sensor of claim 13, wherein the measurement interface comprises:
a first reference voltage source coupled to a first reference pad of the ASIC; and
a second reference voltage source coupled to a second reference pad of the ASIC.

20. The pressure sensor of claim 13, wherein the first switch, the second switch, the third switch, and the fourth switch are set in a first configuration for a normal mode of operation, and wherein the first switch, the second switch, the third switch, and the fourth switch are set in a second configuration for a diagnostic mode of operation.

* * * * *